(12) United States Patent
Butler et al.

(10) Patent No.: US 11,656,257 B2
(45) Date of Patent: May 23, 2023

(54) SYSTEMS AND METHODS FOR PLP CAPACITOR HEALTH CHECK

(71) Applicant: Kioxia Corporation, Tokyo (JP)

(72) Inventors: Timothy Simon Butler, Didcot (GB); Paul Abrahams, San Jose, CA (US)

(73) Assignee: KIOXIA CORPORATION, Tokyo (JP)

(*) Notice: Subject to any disclaimer, the term of this patent is extended or adjusted under 35 U.S.C. 154(b) by 186 days.

(21) Appl. No.: 16/775,138

(22) Filed: Jan. 28, 2020

(65) Prior Publication Data
US 2021/0231720 A1 Jul. 29, 2021

(51) Int. Cl.
*G01R 27/26* (2006.01)
*G01R 31/30* (2006.01)
*G06F 1/30* (2006.01)
*G11C 29/02* (2006.01)

(52) U.S. Cl.
CPC ..... *G01R 27/2688* (2013.01); *G01R 31/3004* (2013.01); *G06F 1/30* (2013.01); *G11C 29/02* (2013.01)

(58) Field of Classification Search
None
See application file for complete search history.

(56) References Cited

U.S. PATENT DOCUMENTS

| | | |
|---|---|---|
| 2010/0332862 A1 | 12/2010 | Lester et al. |
| 2014/0067303 A1* | 3/2014 | Millman ............... H01G 9/008 702/84 |
| 2017/0069356 A1* | 3/2017 | Schmidt ............... G01R 31/40 |
| 2019/0079125 A1 | 3/2019 | Abrahams et al. |

FOREIGN PATENT DOCUMENTS

| | | |
|---|---|---|
| JP | 2003-133189 A | 5/2003 |
| JP | 2008-017613 A | 1/2008 |

OTHER PUBLICATIONS

Zhang, Weixian et al.; Method and System for Detecting Leakage Abnormality of Capacitor, and Computer Device; (Published Dec. 19, 2019).; CRRC Zhuzhou Locomotive Co., LTD; WO 2019237704 A1 (Year: 2019).*
Foreign Search Report on PCT PCT/IB2021/050517 dated Mar. 16, 2021; 12 pages.

* cited by examiner

*Primary Examiner* — Nasima Monsur
(74) *Attorney, Agent, or Firm* — Foley & Lardner LLP (57) ABSTRACT

Various implementations described herein relate to systems and methods for determining abnormal leakage current of a capacitor by determining a number of recent leakage current values for the capacitor and determining a maximum upper limit, minimum upper limit, maximum lower limit, and minimum lower limit based on leakage current values different from the recent leakage current values. A present upper limit and a present lower limit are determined for the recent leakage current values. Abnormal leakage current is determined in response to determining that the present upper limit being greater than an upper threshold (determined based on the maximum upper limit and the minimum upper limit) or the present lower limit being less than a lower threshold (determined based on the maximum lower limit and the minimum lower limit).

20 Claims, 9 Drawing Sheets

SYSTEMS AND METHODS FOR PLP CAPACITOR HEALTH CHECK

TECHNICAL FIELD

The present disclosure relates generally to systems and methods for determining health of Power-Loss-Protection (PLP) capacitors.

BACKGROUND

A Solid State Drive (SSD) receives write commands and associated data from a host and acknowledges the write commands to the host responsive to writing the data to a suitable temporary buffer (e.g., a volatile storage) of the SSD. The data stored in the volatile storage and not yet transferred to the non-volatile storage is referred to as inflight data. Upon detecting a sudden, unexpected power loss, the SSD uses energy stored in backup power capacitors (e.g., PLP capacitors) to write the inflight data to a non-volatile storage of the SSD. In other words, the backup power capacitors function as backup batteries for the SSD.

The backup power capacitors can deteriorate over time. Conventional solutions for detecting and providing warning for deteriorating backup power capacitors include measuring and reporting only capacitance as an indication of capacitor health. When determining capacitor health based on capacitance measurements alone, a very narrow window of capacitance values separates capacitors that are in a "healthy" state from capacitors that are unable to store required energy, due to large tolerances for the capacitance values and measurement circuitry accuracy.

SUMMARY

In certain aspects, the present implementations of a method for determining abnormal leakage current of a capacitor includes identifying a maximum upper limit, a minimum upper limit, a maximum lower limit, and a minimum lower limit for the capacitor and determining a number of recent leakage current values for the capacitor. The maximum upper limit, the minimum upper limit, the maximum lower limit, and the minimum lower limit are determined based on leakage current values different from the recent leakage current values. The method further includes determining a present upper limit and a present lower limit for the recent leakage current values and detecting the abnormal leakage current in response to determining that the present upper limit being greater than an upper threshold or the present lower limit being less than a lower threshold. The upper threshold is determined based on the maximum upper limit and the minimum upper limit. The lower threshold is determined based on the maximum lower limit and the minimum lower limit.

In some embodiments, a system for determining abnormal leakage current of a capacitor includes a processing circuit that identifies a maximum upper limit, a minimum upper limit, a maximum lower limit, and a minimum lower limit for the capacitor and determines a number of recent leakage current values for the capacitor, the maximum upper limit, the minimum upper limit, the maximum lower limit. The minimum lower limit being determined based on leakage current values different from the recent leakage current values. The processing circuit determines a present upper limit and a present lower limit for the recent leakage current values and detects the abnormal leakage current in response to determining that the present upper limit being greater than an upper threshold or the present lower limit being less than a lower threshold. The upper threshold is determined based on the maximum upper limit and the minimum upper limit. The lower threshold is determined based on the maximum lower limit and the minimum lower limit.

In some embodiments, a non-transitory computer-readable medium storing computer-readable instructions, such that when executed, causes a processing circuit to identify a maximum upper limit, a minimum upper limit, a maximum lower limit, and a minimum lower limit for the capacitor and to determine a number of recent leakage current values for the capacitor. The minimum lower limit being determined based on leakage current values different from the recent leakage current values. The processing circuit determines a present upper limit and a present lower limit for the recent leakage current values and detects the abnormal leakage current in response to determining that the present upper limit being greater than an upper threshold or the present lower limit being less than a lower threshold. The upper threshold is determined based on the maximum upper limit and the minimum upper limit. The lower threshold is determined based on the maximum lower limit and the minimum lower limit.

DETAILED DESCRIPTION

The present disclosure relates to systems, methods, and non-transitory computer-readable media for monitoring capacitor health, including providing leakage warning and capacitance reporting. Conventionally, capacitor health is determined based solely on the amount of capacitance remaining in a fully charged capacitor implemented in a flash memory device such as, but not limited to, an SSD. Nevertheless, Applicant recognizes that a fully charged capacitor with high capacitance and high leakage is incapable of providing sufficient power to a flash memory device when the flash memory device experiences a sudden power loss. For example, before the inflight data can be written to the non-volatile storage using energy stored in the capacitor, the energy stored in the capacitor may rapidly decrease such that the voltage of the capacitor may rapidly fall below the minimum operable input voltage of a voltage regulator due to a high leakage current. An increased leakage current effectively reduces the time that the capacitor can provide sufficient operating voltage to the voltage regulator when under load when supplying power to the components of the SSD. Furthermore, deterioration due to aging can reduce the actual capacitance of the capacitor as well as increase the leakage current and internal resistance, due to degradation of the dielectric. Thus, the capacitance by itself is not an accurate indicator of capacitor health.

Applicant further recognizes that an increase in leakage current indicates that backup capacitor circuitry (including backup power capacitors) is deteriorating. In some arrangements, an abnormally high leakage current is detected and reported. Drain currents are alternated in consecutive measurements. Present and previous results are compared to derive the leakage current. Derived leakage current is highly variable such that a single measurement may not provide a true and accurate representation of the actual leakage. Statistical analysis based on standard deviation of derived leakage current values determined using a large population of test results (derived leakage current values) can provide accurate actual leakage. On the other hand, although frequently repeated tests coupled with statistical analysis can detect abnormalities, frequently repeated tests and logging/storing of a large number of test results are impractical in a system embedded in a flash memory device (e.g., an SSD). For example, leakage current can be tested by charging a capacitor to full and determining an amount of energy that the capacitor has leaked within a period of time. While such a testing method, which may take a long period of time to complete, is suitable for factory tests, the testing method is impractical in products. This is because the products (e.g., flash memory devices) are designed to monitor capacitor health throughout the lifetime of the products while the products are continuously performing particular functions/tasks (e.g., flash storage) for which the capacitor is needed (e.g., for backup power in the event of a sudden power loss).

Therefore, by performing statistical analysis on a comparatively small window of results using an embedded system as described herein, abnormally high leakage currents can be accurately detected and reported in a practical manner without needing to perform time-consuming tests or logging a large number of previous test results.

Figure 1:
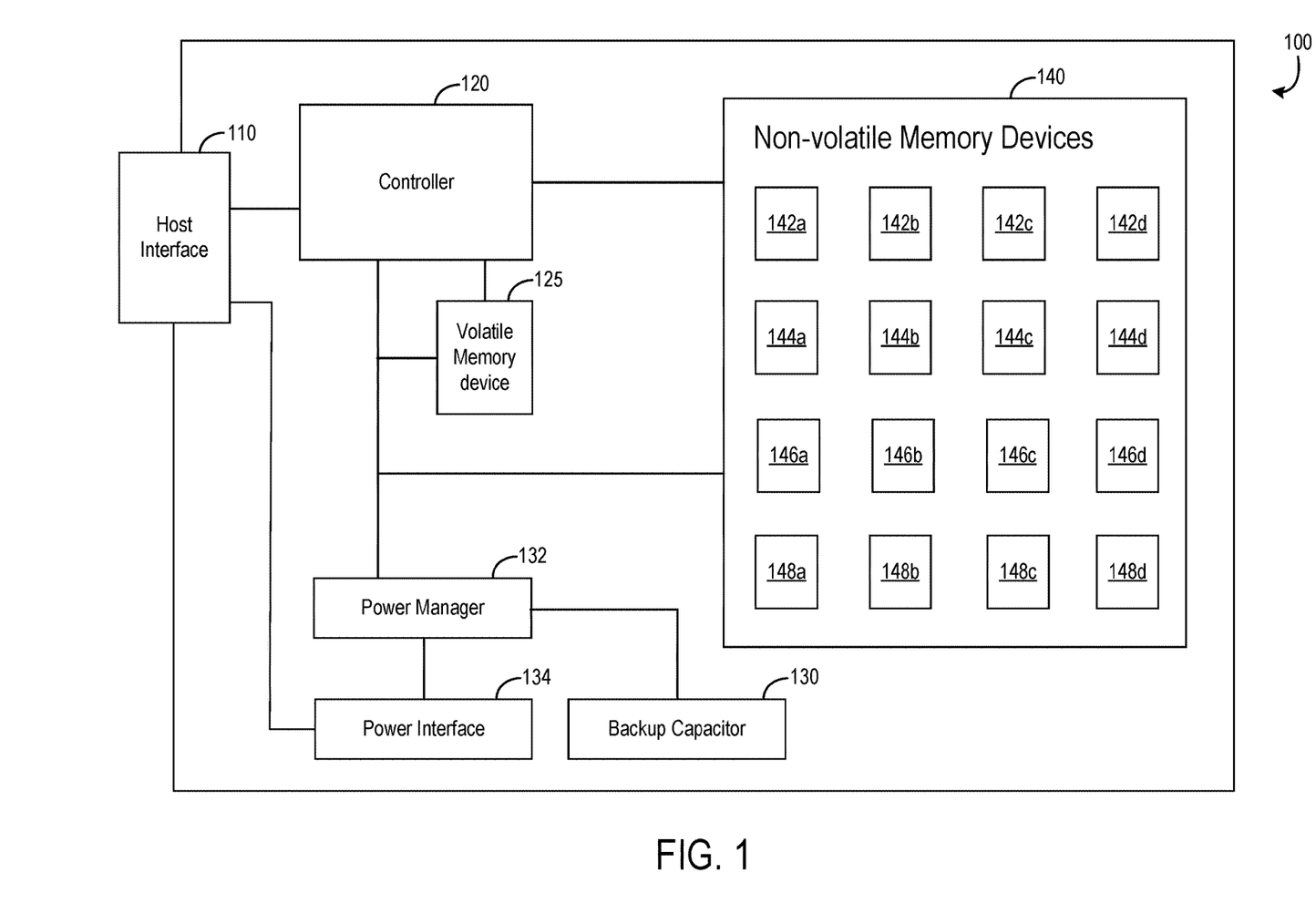
FIG. 1 is an example block diagram of an SSD, according to some implementations.

To assist in illustrating certain aspects of the present disclosure, FIG. 1 is a block diagram of the structure of an SSD 100, according to various implementations. As shown in FIG. 1, the SSD 100 includes a host interface 110, a controller 120, a volatile memory device 125, a backup capacitor 130, a power manager 132, a power interface 134, and an array of non-volatile memory devices 140.

The controller 120 (e.g., an SSD memory controller) is in communication with and operatively coupled to a host device (not shown) through the host interface 110. Examples of the host device include but are not limited to, a computing device, a mass storage appliance, and so on. The host device accesses the SSD 100, for example, by sending write and read commands to the SSD 100. Examples of the host interface 110 include but are not limited to, a Universal Serial Bus (USB) interface, a Serial-Advanced Technology Attachment (SATA) interface, an Enhanced Small Disk Interface (ESDI), a Small Component Small Interface (SCSI), a Peripheral Component Interconnection (PCI) interface, an express Serial Attached SCSI (SAS), an Integrated Drive Electronics (IDE) interface, a Non-Volatile Memory Express (NVMe) interface, and so on.

The volatile memory device 125 and the array of non-volatile memory devices 140 are in communication with and operatively coupled to the controller 120. The non-volatile memory devices 140 refer to non-volatile memory devices 142a-142d, 144a-144d, 146a-146d, and 148a-148d, which can be arranged in one or more channels in communication with the controller 120. In some examples, each of the non-volatile memory devices 140 is a NAND flash memory device, which is a flash memory and includes one or more individual NAND flash dies. The NAND flash memory devices are non-volatile memory capable of retaining data without power. Thus, the non-volatile memory devices 140 refer to a plurality of NAND flash memory devices or dies within the SSD 100. While the NAND flash memory devices are described as examples of the non-volatile memory devices 140, other examples of non-volatile memory technologies for implementing the non-volatile memory storage 120 include but are not limited to, Magnetic Random Access Memory (MRAM), Phase Change Memory (PCM), Ferro-Electric RAM (FeRAM), or the like. While 16 non-volatile memory devices 142a-142d, 144a-144d, 146a-146d, and 148a-148d are shown in FIG. 1, the non-volatile memory devices 140 can include any suitable number of non-volatile memory devices such as, but not limited to, the non-volatile memory devices 142a-142d, 144a-144d, 146a-146d, and 148a-148d.

The controller 120 can combine raw data storage in the non-volatile memory devices 140 such that the non-volatile memory devices 140 function like a single storage. The controller 120 can include microcontrollers, buffers, error correction functionality, Flash Translation Layer (FTL) and flash interface modules, software, and firmware for implementing such functions. In some implementations, the software/firmware can be stored in non-volatile memory devices 140 or in any other suitable computer readable storage medium.

The controller 120 includes suitable processing and memory capabilities for executing functions described herein, among other functions. As described, the controller 120 manages various features for the non-volatile memory devices 140 including, but not limited to, Input/Output (I/O) handling, reading, writing, erasing, monitoring, logging, error handling, garbage collection, wear leveling, logical to physical address mapping, and the like. Thus, the controller 120 provides visibility to the non-volatile memory devices 140 and FTLs associated thereof.

The controller 120 (e.g., an FTL interface module) can perform logic-to-physical (L2P) operations based on an L2P table. For example, the controller 120 can translate a Logical Block Address (LBA) into a physical address, thus resolving the physical address corresponding to the LBA. Responsive to receiving a write or read command (containing a LBA therein) from the host device, the controller 120 (e.g., the FTL interface module) can look up the physical address corresponding to the LBA in order to write to or read from the physical address.

The volatile memory device 125 is a local memory of the controller 120 or a memory device different from or in addition to the local memory of the controller 120. Examples of the volatile memory device 125 include but are not limited to, Random Access Memory (RAM), Dynamic Random Access Memory (DRAM), and Static Random Access Memory (SRAM). The volatile memory device 125 cannot store data without power. The volatile memory device 125 serves as a buffer and stores write commands and data associated therewith from the host device, before the data (e.g., the inflight data) is written to the non-volatile memory device 140.

In some arrangements, the power interface 134 includes any suitable interface (including pins, wires, connectors, transformers, and the like) that connects the SSD 100 to a primary (regular) power supply from a host (not shown) via the host interface 110. The power interface 134 is operatively coupled to the power manager 132. The power manager 132 is operatively coupled to the backup capacitor 130, the controller 120, the volatile memory device 125, the non-volatile memory devices 140, and other components of the SSD 100 not shown to provide power thereto. In some examples, the backup capacitor 130 is used in response to the power interface 134 or the power manager 132 detecting that the power from the primary power supply is interrupted. In that regard, the power interface 134 or the power manager 132 includes suitable circuitry for detecting whether the primary power supply is interrupted and for the power manager 132 switching between primary power to backup power (e.g., from energy stored in the backup capacitor 130). The power interface 134 includes a voltage regulator that regulates the voltage from the primary (e.g., the power interface 134) and backup power (i.e. backup capacitor 130) supplies to an operation voltage of the controller 120, the volatile memory device 125, the non-volatile memory devices 140, and other components of the SSD 100.

The backup capacitor 130 (e.g., a PLP capacitor, a backup power capacitor, and so on) can be a single capacitor or multiple capacitors arranged in banks or any other suitable configuration. The backup capacitor 130 can be one or more supercapacitors, ultracapacitors, tantalum electrolytic capacitors, monolithic ceramic capacitors, aluminum electrolytic capacitors, or another type of capacitors capable of storing charges (backup power) and providing the backup power to the SSD 100. The backup capacitor 130 is operatively coupled to the power manager 132 and in the event that the primary power from the power interface 134 is interrupted (e.g., due to a system power loss or failure event), the power manager 132 receives power from the backup capacitor 130. During normal operation (e.g., when the power interface 134 is receiving power via the host interface 110), the power manager 132 supplies power to the backup capacitor 130, keeping it in a charged state in readiness for any interruption or sudden loss of power from the host interface 110.

In one example, in the event of power interruption, the backup capacitor 130 is designed, by supplying power to the power manager 132, to provide backup power to the controller 120, the volatile memory device 125, and the non-volatile memory devices 140 for a period of time for the controller 120 to write inflight data stored in the volatile memory device 125 to the non-volatile memory devices 140. The backup capacitor 130 is operatively coupled to a voltage regulator (not shown, located within the power manager 132) that regulates the voltage stored in the backup capacitor 130 to an operation voltage of the controller 120, the volatile memory device 125, the non-volatile memory devices 140, and other components of the SSD 100.

The energy stored by the backup capacitor 130 while supplying power to the power manager 132 during a power loss event depends on various factors, including, but not limited to, the power consumption of the controller 120, the array of non-volatile memory devices 140, and the volatile memory device 125, the amount of time needed for the inflight data to be written to the non-volatile memory devices 140, and so on.

The backup capacitor 130 is preferred to provide backup power commensurate with the energy required for the amount of time needed for the inflight data to be written to the non-volatile memory devices 140 following any power loss event during the lifetime of the SSD 100. The lifetime of the SSD 100 varies from manufacturer to manufacturer, and depends on considerations such as, but not limited to, whether the SSD 100 is designed for consumer or enterprise applications. The lifetime can range from two years to up to 10 years, for example. During the lifetime, the backup capacitor 130 may degrade as the backup capacitor 130 begins to lose capacitance and experience abnormally high leakage, up to a point where the backup capacitor 130 cannot provide sufficient backup power for the amount of time needed for the inflight data to be written to the non-volatile memory devices 140. In other words, before all inflight data can be written to the non-volatile memory devices 140, the energy stored in the backup capacitor 130 may become depleted to the point where the capacitor voltage has decreased below the minimum operable input voltage of a voltage regulator, due to leakage over time, and thus may be unable to provide power to write all inflight data to the non-volatile memory devices 140.

In order to monitor the health of the backup capacitor 130, the backup capacitor 130 is tested periodically during its lifetime to determine capacitance and leakage. Because many applications of the SSD 100 (such as, but not limited to, in a datacenter or other server environment) require the SSD 100 to operate continuously, the SSD 100 tests the backup capacitor 130 during the normal operations of the SSD 100 (e.g., when the host device is actively writing and reading data to and from, respectively, the SSD 100). This is because the SSD 100 lacks any "convenient" opportunity (e.g., during shutdown or initial power-up of the host device) to test the backup capacitor 130 outside of normal working conditions.

In some implementations, the power manager 132 can be operatively coupled to the backup capacitor 130 to monitor the health of the backup capacitor 130 by administering the leakage current tests in the manner described herein. The power manager 132 can be a power management integrated circuit (PMIC) which includes suitable processing and memory capabilities for executing functions described herein. The power manager 132 and the controller 120 can be implemented using a same circuitry or different circuitries.

The SSD 100 illustrates a context in which the mechanism for detecting abnormal leakage current of a capacitor can be implemented. The same mechanism can be implemented for another device that lacks a convenient opportunity to test the capacitor outside of normal working conditions of that capacitor. That is, the mechanism described herein can be implemented in any system in which administering leakage current tests having long sampling time (as supposed to two quick successive tests to determine the drain currents as described herein) or requiring storage of a large amount of test results is inefficient or impractical. In that regard, the power manager 132 can be any suitable processing circuit operatively coupled to a capacitor that can detect abnormal leakage in the manner described.

Figure 2:
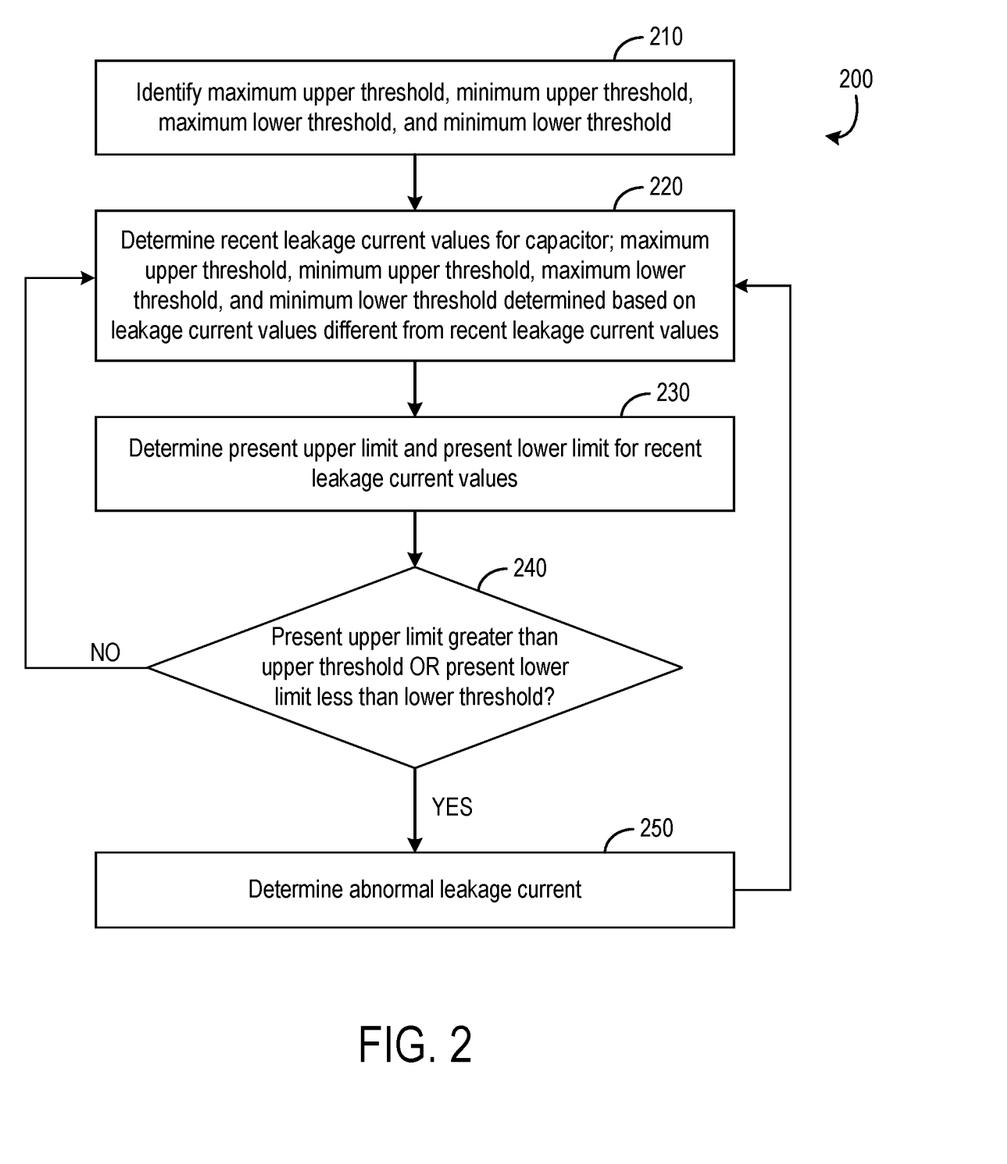
FIG. 2 is an example flowchart of a method for determining abnormal leakage current of a capacitor, according to some implementations.

FIG. 2 shows an example flowchart of a method 200 for determining abnormal leakage current of a capacitor, according to some implementations. Referring to FIGS. 1-2, the method 200 can be performed by a suitable processing circuit (e.g., the power manager 132) operatively coupled to a capacitor (e.g., the backup capacitor 130).

At 210, the processing circuit identifies a maximum upper limit, a minimum upper limit, a maximum lower limit, and a minimum lower limit for the capacitor. At 220, the processing circuit determines a number of recent leakage current values for the capacitor. The maximum upper limit, the minimum upper limit, the maximum lower limit, and the minimum lower limit are determined based on leakage current values different from the recent leakage current values, in some examples.

At 230, the processing circuit determines a present upper limit and a present lower limit for the recent leakage current values. At 240, the processing circuit determines whether the present upper limit is greater than an upper threshold or the present lower limit is less than a lower threshold. In response to determining that the present upper limit is greater than the upper threshold or the present lower limit is less than the lower threshold (240:YES), abnormal leakage current is detected, at 250.

The upper threshold is an average of the maximum upper limit and the minimum upper limit. The lower threshold is an average of the maximum lower limit and the minimum lower limit.

In some arrangements, the processing circuit determines the recent leakage current values by conducting multiple most-recent leakage current tests. The processing circuit derives each recent leakage current value in a corresponding one of the most-recent leakage current tests. To illustrate, FIG. 3 is an example graph 300 illustrating leakage current values determined for a capacitor (e.g., the backup capacitor 130) over time, according to some implementations.

Figure 3:
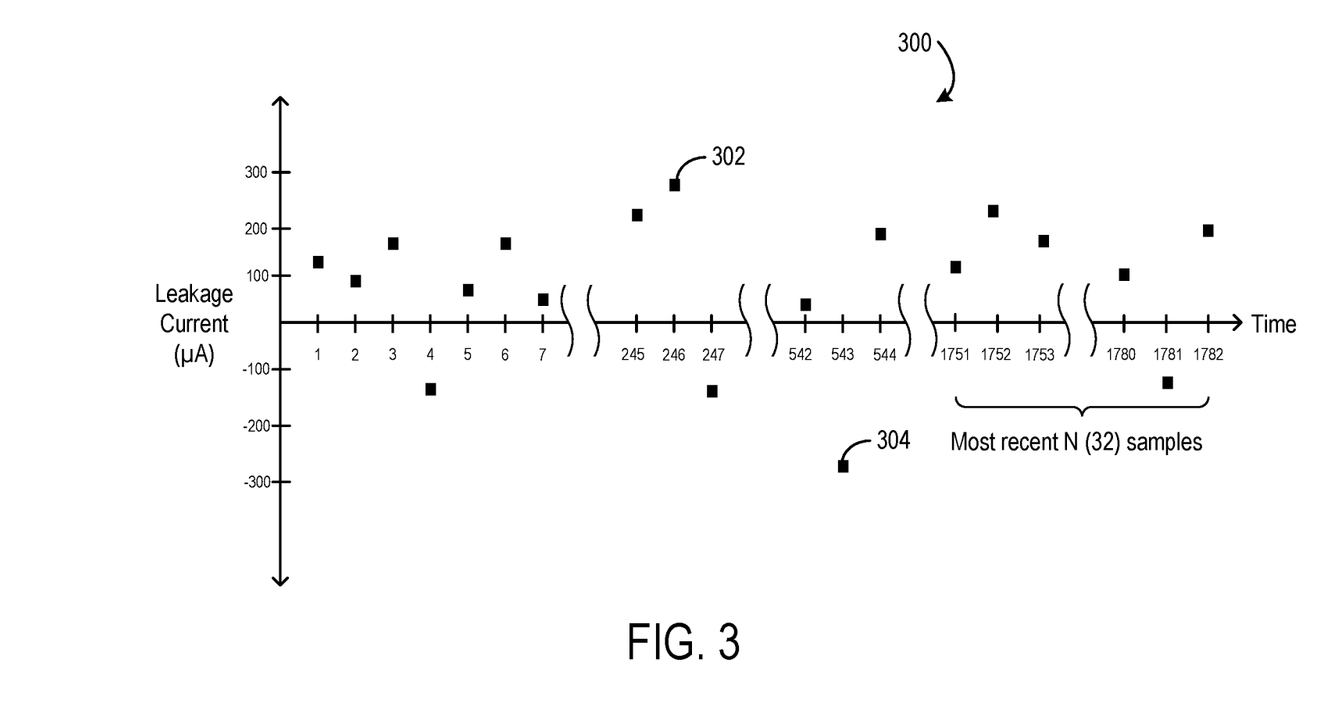
FIG. 3 is an example graph illustrating leakage current values determined for a capacitor over time, according to some implementations.

Referring to FIGS. 1-3, in the graph 300, the X-axis corresponds to leakage current tests (e.g., a first (1) leakage current test, a second (2) leakage current test, . . . , and a 1782th (1782) current test) performed over time, during the lifetime of the capacitor (e.g., the lifetime of the SSD 100). The first (1) leakage current test is the very first leakage current test performed on the capacitor, and no other leakage current test had been performed before the first (1) leakage current test. The 1782th (1782) leakage current test is the most-recent leakage current test performed on the capacitor, and no other leakage current test has yet been performed after the 1782th (1782) leakage current. The leakage current tests can be performed periodically. The testing frequency can vary depending on a number of factors, including the specific configuration of the SSD 100, the intended application of the SSD 100, the specified operating lifetime of the SSD 100, and so on. Examples of the testing frequency include but are not limited to, once an hour, once a day, once every two or more days, and so on. The testing frequency can be adjusted depending on specific circumstances and operational requirements of the SSD 100. The Y-axis corresponds to leakage current values (in pA) determined in each leakage current test.

The recent leakage current values are the results of a number of most-recent leakage current tests conducted on the capacitor. In the example in which the number is 32, the recent leakage current values are the results of the most-recent 32 leakage current tests, including the 1751st (1751), 1752nd (1752), . . . , and the 1782th (1782) leakage current tests. The recent leakage current values are within a small window of sampled results needed to establish a standard deviation and a mean, which is used to set the upper limit and the lower limit (e.g., at 230) in the manner described herein.

The window is a dynamic, moving window, meaning that as a new and more recent leakage current test is performed, the leakage current value derived from the new leakage current test is added to the number N of most-recent leakage current values while the leakage current value derived from the leakage current test performed earliest in time out of the leakage current tests within the window is removed. Accordingly, to determine the standard deviation and the mean, a memory device (e.g., the non-volatile memory devices 140, the volatile memory device 125, or another suitable memory device) needs to store the same number (e.g., 32 samples) of recent leakage current values within the window instead of storing the leakage current values derived from all leakage current tests (1st-1782nd) performed within the lifetime of the capacitor. In other words, the most-recent leakage current value (e.g., the leakage current value derived from the 1783th (1783) leakage current test) is stored in the memory device as the earliest recent leakage current value within the window (e.g., the leakage current value derived from the 1751th (1751) leakage current test) is erased from the memory device.

In addition, the memory device stores the maximum upper limit, the minimum upper limit, the maximum lower limit, and the minimum lower limit of all leakage current values derived from all leakage current tests (1st-1782nd) performed within the lifetime of the capacitor. In particular, the maximum upper limit is a maximum of the upper limit determined for the leakage current values derived from all leakage current tests performed within the lifetime of the capacitor. The minimum upper limit is a minimum of the upper limit determined for the leakage current values derived from all leakage current tests performed within the lifetime of the capacitor. The maximum lower limit is a maximum of the lower limit determined for the leakage current values derived from all leakage current tests performed within the lifetime of the capacitor. The minimum lower limit is a minimum of the lower limit determined for the leakage current values derived from all leakage current tests performed within the lifetime of the capacitor.

In response to performing a new and more recent leakage current test, the processing circuit determines the standard deviation and the mean for the most-recent leakage current values, which include the new leakage current value derived from the new leakage current test and the stored N−1 most-recent leakage current values. Based on standard deviation and the mean, processing circuit determines an upper limit and a lower limit in the manner described herein. In response to determining that the upper limit is greater than a stored maximum upper limit, the processing circuit sets the upper limit as the maximum upper limit. In response to determining that the upper limit is less than a stored minimum upper limit, the processing circuit sets the upper limit as the minimum upper limit. In response to determining that the lower limit is greater than a stored maximum lower limit, the processing circuit sets the lower limit as the maximum lower limit. In response to determining that the lower limit is less than a stored minimum lower limit, the processing circuit sets the lower limit as the minimum lower limit.

In the example of the graph 300 in which 1782 leakage current tests have been performed, the processing circuit determines the maximum upper limit responsive to deriving the leakage current value 302 from the 246th leakage current test, e.g., the maximum upper limit is determined based on leakage current values determined from the 215th-246th leakage current tests. The processing circuit determines the minimum upper limit responsive to deriving the leakage current value 304 from the 543th leakage current test, e.g., the minimum upper limit is determined based on leakage current values determined from the 512nd-543th leakage current tests. The processing circuit determines the maximum lower limit responsive to deriving the leakage current value (not shown) from the 119th leakage current test, e.g., the maximum lower limit is determined based on leakage current values determined from the 88th-119th leakage current tests. The processing circuit determines the minimum lower limit responsive to deriving the leakage current value (not shown) from the 474th leakage current test, e.g., the minimum lower limit is determined based on leakage current values determined from the 474th-443th leakage current tests.

In these examples, the maximum upper limit, the minimum upper limit, the maximum lower limit, and the minimum lower limit are determined using leakage current values derived from leakage current tests performed on the capacitor before performance of the most-recent leakage current tests (e.g., the 1751th-1782th leakage current tests). In other examples, one or more of the maximum upper limit, the minimum upper limit, the maximum lower limit, or the minimum lower limit are determined using one or more leakage current values derived from one or more of the most-recent leakage current tests (e.g., the 1751th-1782th leakage current tests).

Figure 4A:
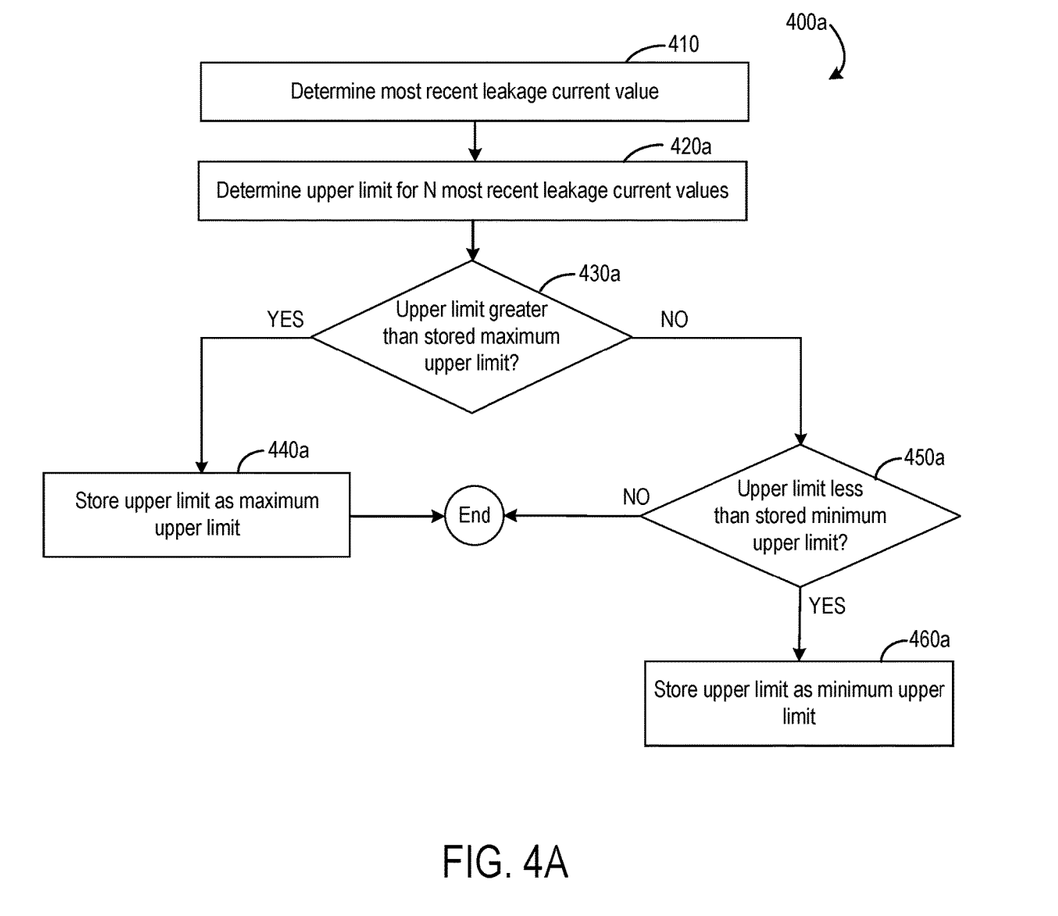
FIG. 4A is an example flowchart of a method for determining a maximum upper limit and a minimum upper limit, according to some implementations.

FIG. 4A is an example flowchart of a method 400a for identifying a maximum upper limit and a minimum upper limit, according to some implementations. Referring to FIGS. 1-4A, the processing circuit (e.g., the power manager 132) determines a most-recent leakage current value, at 410. The most-recent leakage current value determined at 410 is the leakage current value determined in the most-recent leakage current test.

At 420a, the processing circuit determines an upper limit for the number N of most-recent leakage current values. The N of most-recent leakage current values include the new leakage current value determined at 410 and the stored N−1 most-recent leakage current values.

At 430a, the processing circuit determines whether the upper limit determined at 420a is greater than the stored maximum upper limit. The stored upper limit can be stored in a memory device (e.g., the non-volatile memory devices 140, the volatile memory device 125, or another suitable memory device). The stored maximum upper limit is the largest upper limit of all upper limits determined based on all leakage current values, which are derived from all leakage current tests performed within the lifetime of the capacitor so far.

At 440a, in response to determining that the upper limit determined at 420a is greater than the stored maximum upper limit (430a:YES), the processing circuit stores the upper limit determined at 420a in the memory device as the maximum upper limit.

On the other hand, in response to determining that the upper limit determined at 420a is not greater than the stored maximum upper limit (430a:NO), the processing circuit determines whether the upper limit determined at 420a is less than the stored minimum upper limit. The stored minimum upper limit can be stored in the memory device. The stored minimum upper limit is the lowest upper limit of all upper limits determined based on all leakage current values, which are derived from all leakage current tests performed within the lifetime of the capacitor so far.

At 460a, in response to determining that the upper limit determined at 420a is less than the stored minimum upper limit (450a:YES), the processing circuit stores the upper limit determined at 420a in the memory device as the minimum upper limit. Otherwise (450a:NO), the upper limit determined at 420a is neither the maximum upper limit nor the minimum upper limit.

Blocks 430a and 450a can be performed simultaneously or in any suitable order. The method 400a can be performed every time a new leakage current value is derived from a newly performed leakage current test.

Figure 4B:
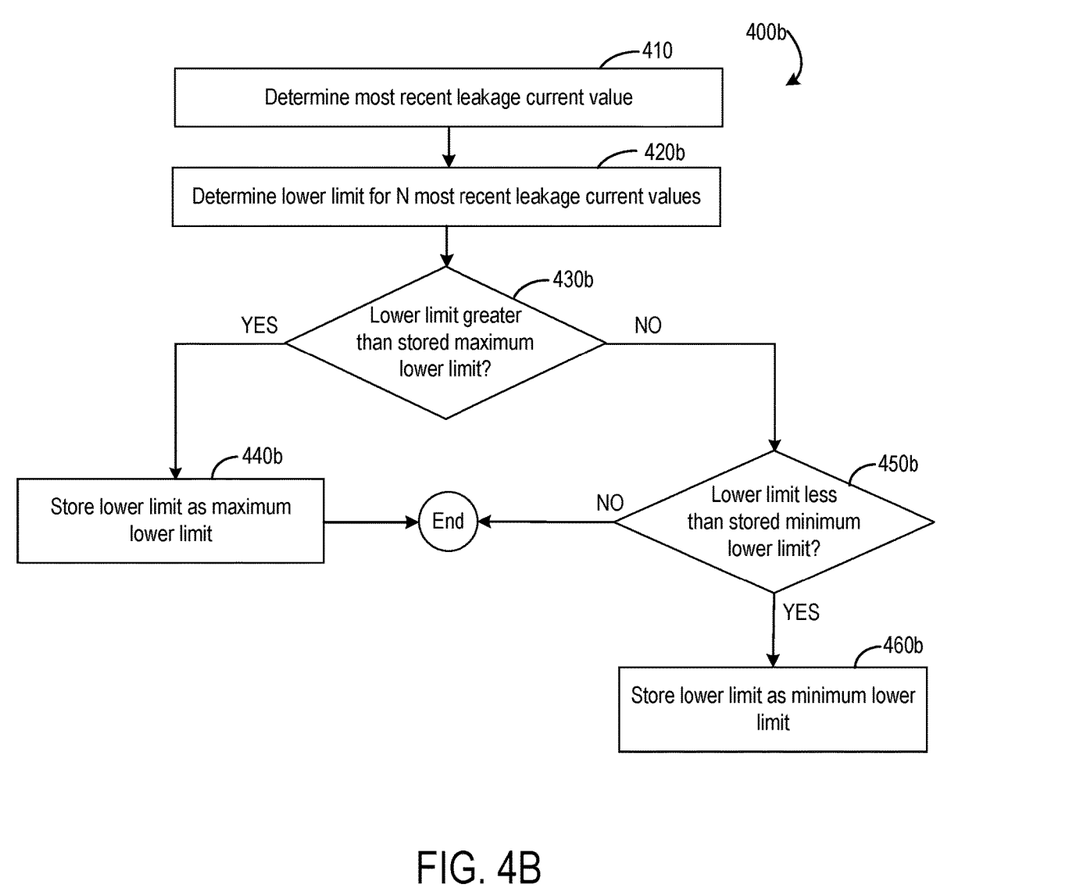
FIG. 4B is an example flowchart of a method for determining a maximum lower limit and a minimum lower limit, according to some implementations.

FIG. 4B is an example flowchart of a method 400b for identifying a maximum lower limit and a minimum lower limit, according to some implementations. Referring to FIGS. 1-4B, the processing circuit (e.g., the power manager 132) determines a most-recent leakage current value, at 410. At 420b, the processing circuit determines a lower limit for the number N of most-recent leakage current values. The upper limit determined at 420a and the lower limit determined at 420b are determined for the same N most-recent leakage current values. Accordingly, blocks 420a-460a and blocks 420b-460b can be performed simultaneously or in any suitable order.

At 430b, the processing circuit determines whether the lower limit determined at 420b is greater than the stored maximum lower limit. The stored lower limit can be stored in a memory device (e.g., the non-volatile memory devices 140, the volatile memory device 125, or another suitable memory device). The stored maximum lower limit is the largest lower limit of all lower limits determined based on all leakage current values, which are derived from all leakage current tests performed within the lifetime of the capacitor so far.

At 440b, in response to determining that the lower limit determined at 420b is greater than the stored maximum lower limit (430b:YES), the processing circuit stores the lower limit determined at 420b in the memory device as the maximum lower limit.

On the other hand, in response to determining that the lower limit determined at 420b is not greater than the stored maximum upper limit (430b:NO), the processing circuit determines whether the lower limit determined at 420b is less than the stored minimum lower limit. The stored minimum lower limit can be stored in the memory device. The stored minimum lower limit is the lowest lower limit of all lower limits determined based on all leakage current values, which are derived from all leakage current tests performed within the lifetime of the capacitor so far.

At 460b, in response to determining that the lower limit determined at 420b is less than the stored minimum lower limit (450b:YES), the processing circuit stores the lower limit determined at 420b in the memory device as the minimum lower limit. Otherwise (450b:NO), the lower limit determined at 420b is neither the maximum lower limit nor the minimum lower limit.

Blocks 430b and 450b can be performed simultaneously or in any suitable order. The method 400b can be performed every time a new leakage current value is derived from a newly performed leakage current test.

The upper limit and the lower limit can be determined using a standard deviation (e.g., a population standard deviation) and a mean (average) of the recent leakage current values. In one example, the population standard deviation can be determined using expression (1):

$$\sigma = \sqrt{\frac{1}{N}\sum_{i=1}^{N}(x_i - \mu)^2} ; \quad (1)$$

where N is the number of the most-recent leakage current values. In addition, $x_i$ represents each leakage current value of the most-recent leakage current values (within the window), and $\mu$ is the mean of the most-recent leakage current values. An example of N is 32. N can be set to a value such that an accurate standard deviation can be calculated using the N recent leakage current values while storing N leakage current values does not pose a significant burden to the memory device.

In some arrangements, the upper limit and the lower limit are determined based on multiples of the standard deviation. For example, the upper limit ($I_u$) is a sum of the mean ($\mu$) and a multiple (A) of the standard deviation ($\sigma$), as shown in expression (2):

$$I_u = \mu + A*\sigma \qquad (2).$$

The lower limit ($I_l$) is the mean ($\mu$) subtracted by a multiple (A) of the standard deviation ($\sigma$), as shown in expression (3):

$$I_l = \mu - A*\sigma \qquad (3).$$

In some examples, the multiple A is any value between 2-10.

Figure 5:
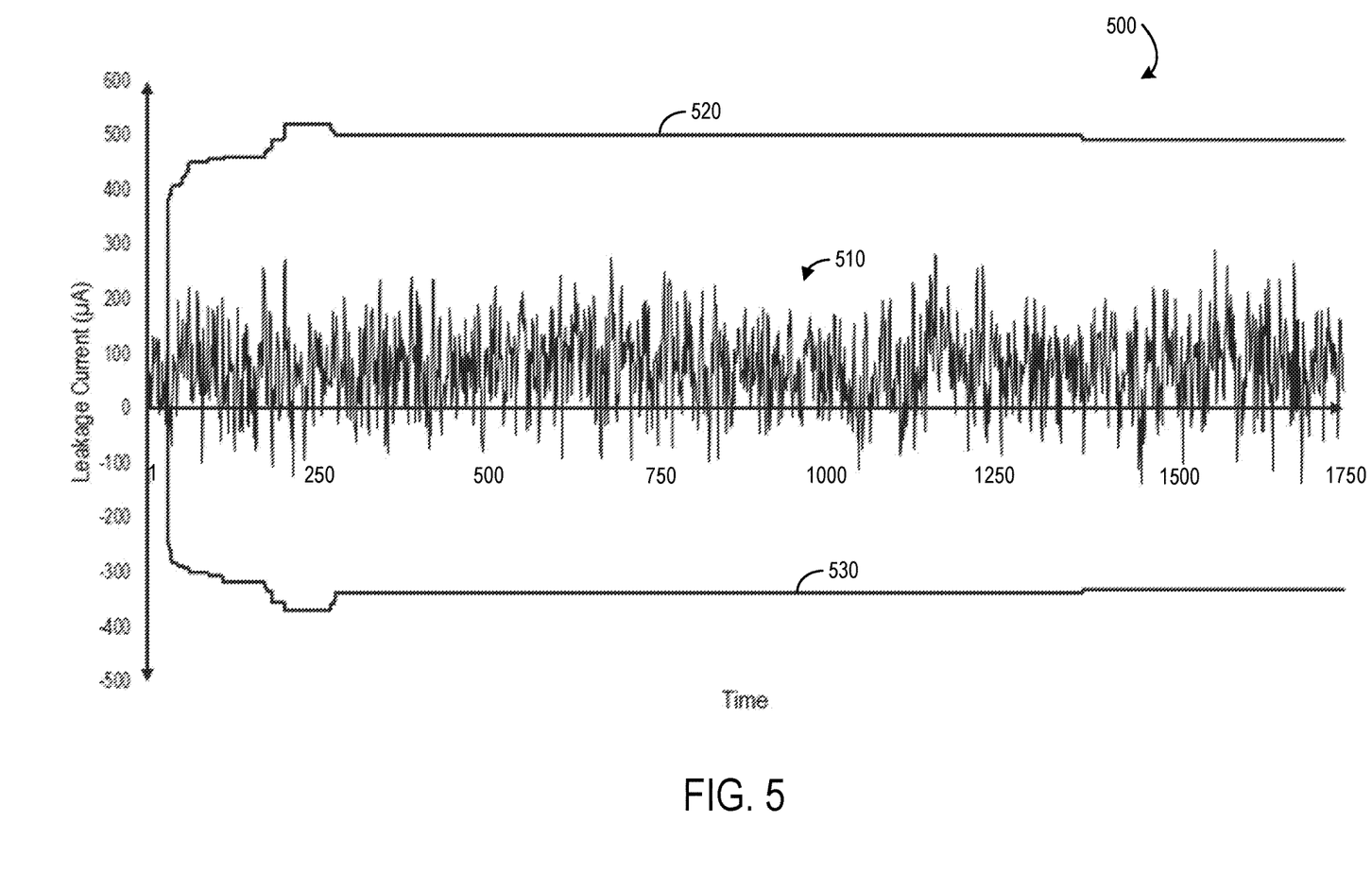
FIG. 5 is an example graph illustrating leakage current values, upper thresholds, and lower thresholds determined for a capacitor over time, according to some implementations.

FIG. 5 is an example graph 500 illustrating leakage current values 510, upper thresholds 520, and lower thresholds 530 determined for a capacitor over time according to some implementations. Referring to FIGS. 1-5, in the graph 500, the X-axis corresponds to leakage current tests (e.g., a first (1) leakage current test, . . . , a 250th (250) leakage current test, . . . , and a 1750th (1750) leakage current test) performed over time, during the lifetime of the capacitor (e.g., the lifetime of the SSD 100). The graph 500 shows that a total of 1750 leakage current tests have been performed over time, with the 1750th leakage current test. The Y-axis corresponds to leakage current values (in µA) determined in each leakage current test.

After N (e.g., 32) leakage current values have been collected, the processing circuit can determine the upper limit and the lower limit responsive to determining each leakage current value. The maximum upper limit, the minimum upper limit, the maximum lower limit, and the minimum lower limit can be stored, for example, using the methods 400a and 400b. Each of the upper thresholds 520 is an average of the maximum upper limit and the minimum upper limit determined responsive to deriving a leakage current value from a leakage current test (after N leakage current tests have been performed). Each of the lower thresholds 530 is an average of the maximum lower limit and the minimum lower limit determined responsive to deriving a leakage current value from a leakage current test (after N leakage current tests have been performed). Accordingly, each of the upper thresholds 520 and each of the lower thresholds 530 corresponds to a leakage current value/test.

As shown, after about 300 leakage current tests, the upper thresholds 520 stabilize around 500 µA, and the lower thresholds 530 stabilize around −350 µA. In that regard, the storing/logging of the maximum upper limit, the minimum upper limit, the maximum lower limit, and the minimum lower limit according to the methods 400a and 400b is implemented within an initial window, e.g., using leakage current values derived from the initial M leakage current tests (from the 1st leakage current test to the Mth leakage current test). Examples of M include but are not limited to, 200, 300, 400, 500, and so on. In some examples, the initial M leakage current tests can be performed in a factory or laboratory setting, e.g., before the product such as the SSD 100 is deployed for its intended applications.

In response to determining that an upper limit determined for the most-recent leakage current values (upon the most-recent leakage current value is derived) being greater than the corresponding upper threshold (e.g., the average of the maximum upper limit and the minimum upper limit when the most-recent leakage current value is derived), the upper limit is reported, for example, to the host device or another suitable device. The most-recent leakage current value can be excluded from the most-recent leakage current values used to calculated the average or standard deviation in the future. That is, the most-recent leakage current value corresponding to the determination of abnormal leakage is removed from the sampling window to avoiding skewing of the standard deviation. The skewing of the standard deviation can potentially silence repeated findings of abnormal leakage current of a failing capacitor.

Figure 6:
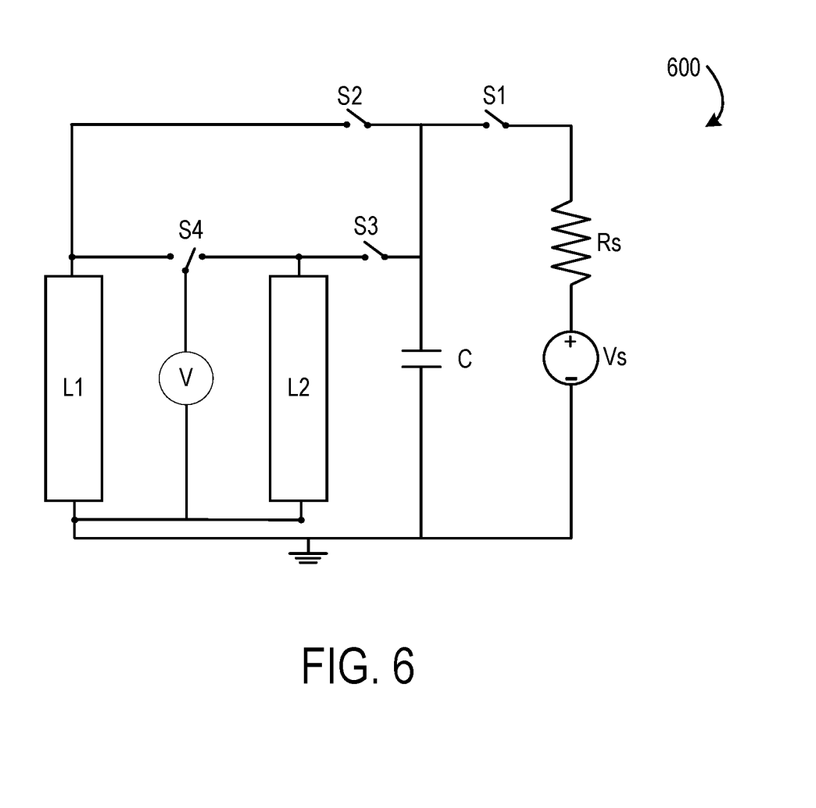
FIG. 6 is a circuit diagram illustrating a leakage current test circuitry, according to some implementations.

In some arrangements, each leakage current value can be determined based on two drain currents. FIG. 6 is a circuit diagram illustrating a leakage current test circuitry 600, according to some implementations. Referring to FIG. 6, the leakage current test circuitry 600 can be an component of the power manager 132. In one example, the leakage current test is a discharge test (alternated drain current test) which involves applying two known loads L1 and L2 across the capacitor C (e.g., the backup capacitor 130) successively and measuring voltage drops over time as the capacitor C discharges through each of the two loads L1 and L2, respectively in different tests. The amount of time the loads L1 and L2 are applied to the capacitor C for the discharge test may also vary depending on the load applied, but will typically range in the 10's of milliseconds (ms) or more.

In one example, the power manager 132 controls all switches S1, S2, S3, and S4 to be opened. The power manager 132 controls the switch S1 to close, to allow a voltage source Vs to charge the capacitor C through resistive load Rs. Upon charging the capacitor C to the fullest, the power manager 132 controls the switch S1 to open, controls the switch S2 to close, and controls the switch S4 to be toggled to measure the voltage across the load L1 (which is the same as the voltage across capacitor C, enabling the charge and energy stored in the capacitor to be calculated). The drain current of the capacitor C can be measured based on the energy loss of the capacitor C or the drop of the voltage across the load L1 over a period of time.

Then, the power manager 132 controls all switches S1, S2, S3, and S4 to be opened, and controls the switch S1 to close to allow the voltage source Vs to again charge the capacitor C through resistive load Rs. Upon charging the capacitor C to the fullest, the power manager 132 controls the switch S1 to open, controls the switch S3 to close, and controls the switch S4 to be toggled to measure the voltage or energy across the load L2. The drain current of the capacitor C can be measured based on the energy loss of the capacitor C or the drop of the voltage across the load L2 over the period of time.

L1 and L2 have sufficiently large impedances, and the configuration of the output of the voltage sources Vs and the impedances of L1 and L2 allow the drain current flowing through L1 and L2 to be, for example, 5 mA and 10 mA, respectively. Assuming that the leakage current is constant and the same for both tests, the capacitor C can be drained through L1 and L2 respectively. For the first test using L1, a first capacitance of the capacitor C can be determined. For the second test using L2, a second capacitance of the capacitor C can be determined. The leakage current can be determined by comparing two capacitance measurements. Assuming a constant capacitance in every test, any difference in measured capacitance would be due to the leakage current.

Figure 7:
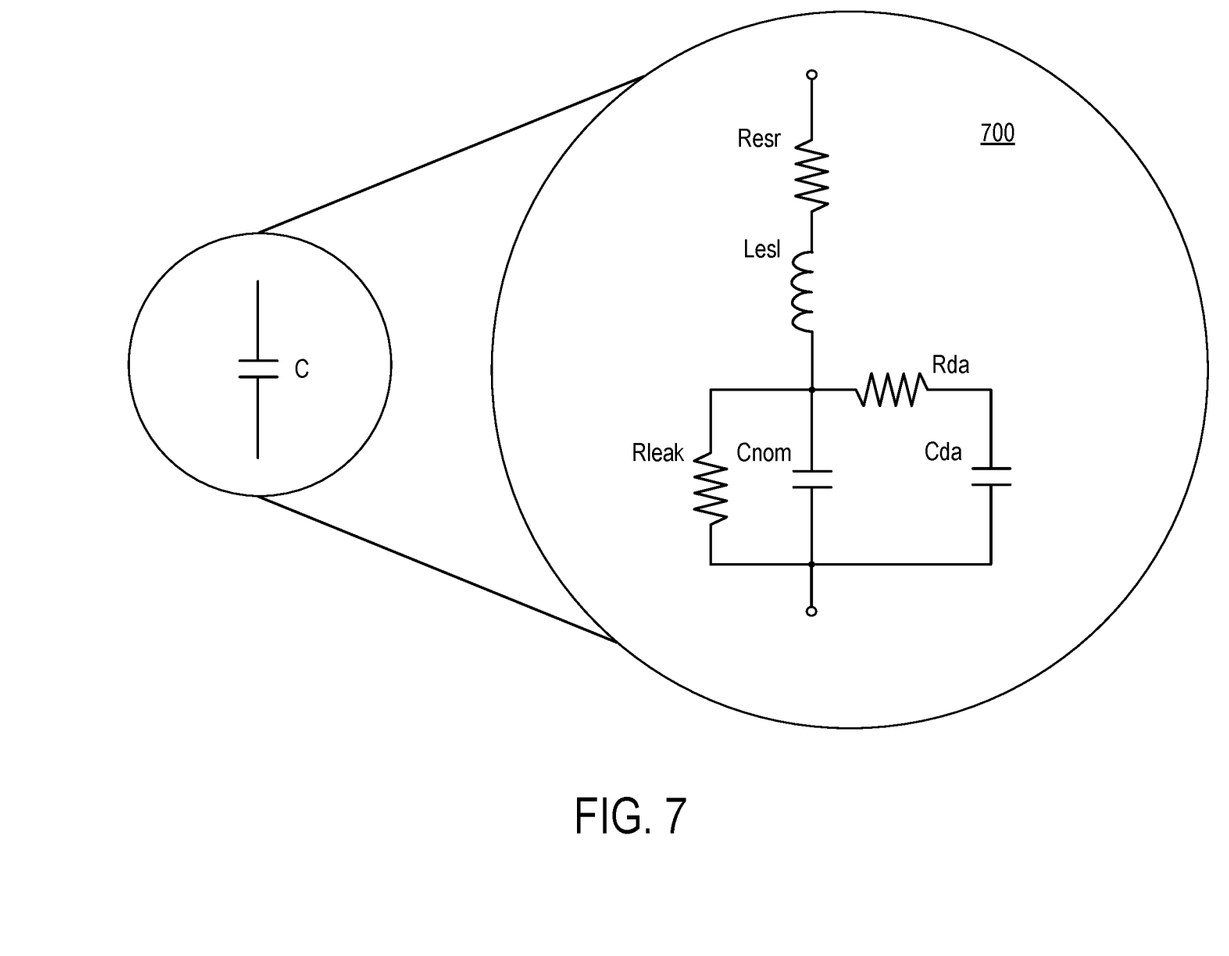
FIG. 7 is a circuit diagram illustrating a non-ideal capacitor, according to some implementations.

FIG. 7 is a circuit diagram illustrating a non-ideal capacitor 700 (e.g., the capacitor C of FIG. 6), according to some implementations. Referring to FIGS. 1-7, any real-world capacitor (e.g., the capacitor C of FIG. 6) is a non-ideal capacitor such as but not limited to, the non-ideal capacitor 700. The non-ideal capacitor 700 can be modeled using components such as but not limited to, Resr, Lesl, Rda, Cda, Cnom, and Rleak. Cnom represents a nominal capacitance value of the ideal capacitor. Rleak is a parallel resistance across the nominal capacitance Cnom. Leakage current $I_{leak}$ of the non-ideal capacitor 700 is modeled as the current through Rleak, and is independent of any load current being drawn by a load (not shown in FIG. 7) from the non-ideal capacitor 700. Resr refers to an equivalent series resistance. Lesl refers to an equivalent series inductance. Rda refers to a resistance due to dielectric adsorption. Cda refers to a capacitance due to dielectric adsorption.

In some arrangements, the capacitance C of the capacitor C (FIG. 6), taking into account leakage current $I_{leak}$ across Rleak (FIG. 7), can be presented by expression (4):

$$C = (I_{drain} + I_{leak})\frac{dv}{dt}; \tag{4}$$

where $I_{drain}$ is the drain current, and $$\frac{dv}{dt}$$

represents an instantaneous rate of voltage change (volts per second).

Figure 8:
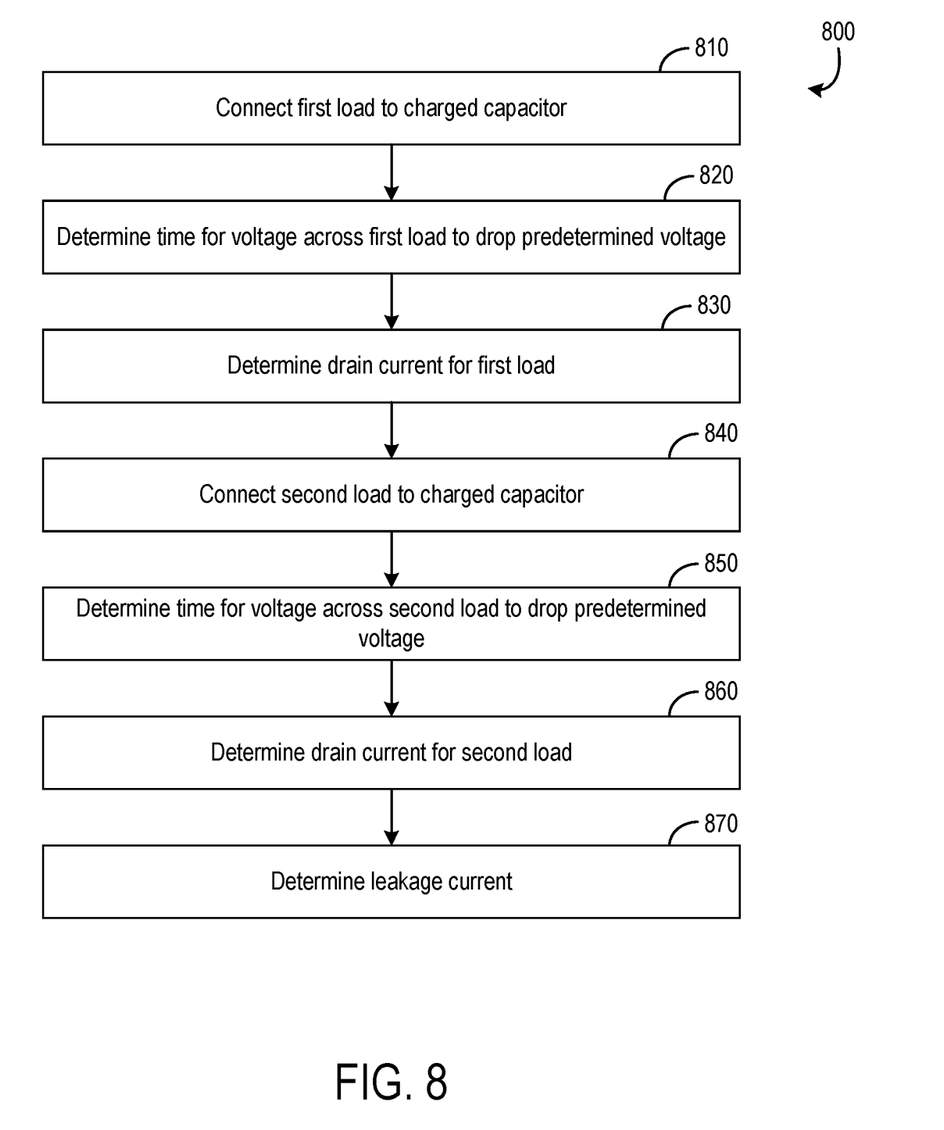
FIG. 8 is an example flowchart of a method for determining leakage current of a capacitor, according to some implementations.

The leakage current $I_{leak}$ can be determined using two successive tests, one using L1 and another using L2 (FIG. 6) and, for example, using a method 800 shown in FIG. 8. FIG. 8 is an example flowchart of the method 800 for determining the leakage current $I_{leak}$ of a capacitor (e.g., the capacitor 700), according to some implementations.

Referring to FIGS. 1-8, at 810, a first load (L1 of the leakage current test circuitry 600) is connected to a charged capacitor (the capacitor C of the leakage current test circuitry 600). The capacitor can be charged using Vs, Rs, and S1 of the leakage current test circuitry 600 prior to connecting the first load to the capacitor. The first load is connected to the capacitor by closing the switch S2.

At 820, the time interval $dt_A$ it takes for the voltage across the first load to drop a predetermined voltage dv is determined. In some examples, the predetermined voltage dv may be selected to be small (e.g., 1 V) to minimize test time while maintaining an accurate result. The predetermined voltage dv can be determined using any suitable voltages, for example, from a first voltage V1 (e.g., 29 V) to a second voltage V2 (e.g., 28 V).

At 830, the drain current $I_A$, which is the drain current $I_{drain}$ measured across the first load, is determined. In one example, the drain current drain current $I_A$ can be approximated by the mid-point voltage (e.g., 28.5 V if the voltage drop is from 29 to 28) divided by the load resistance of the first load. Blocks 820 and 830 can be determined in a same test using the first load (in a single current drain) using the voltage meter V and a timer (not shown) of the circuitry 600. The switch S2 opens after blocks 820 and 830 have been performed.

Next, at 840, a second load (L2 of the leakage current test circuitry 600) is connected to the charged capacitor. The capacitor can be charged again using Vs, Rs, and S1 of the leakage current test circuitry 600 prior to connecting the second load to the capacitor and after (e.g., immediately or within a predetermined period of time) blocks 820 and 830 have been completed. The second load is connected to the capacitor by closing the switch S3.

At 850, the time interval $dt_B$ it takes for the voltage across the second load to drop the predetermined voltage dv is determined. At 860, the drain current $I_B$, which is the drain current $I_{drain}$ measured across the second load, is determined. In one example, the drain current drain current $I_B$ can be approximated by the mid-point voltage (e.g., 28.5 V if the voltage drop is from 29 to 28) divided by the load resistance of the second load. Blocks 840 and 850 can be determined in a same test using the second load (in a single current drain) using the voltage meter V and the timer (not shown) of the circuitry 600.

At 870, the leakage current $I_{leak}$ can be determined, for example, using the expression (9) as shown below. Assuming that the capacitance C of the capacitor C and the leakage current $I_{leak}$ are constant for the two successive tests, expression (5) holds true:

$$(I_A + I_{leak})\frac{dt_A}{dv} = (I_B + I_{leak})\frac{dt_B}{dv}. \tag{5}$$

From expression (5), the leakage current $I_{leak}$ can be derived through expressions (6)-(9):

$$I_A \cdot dt_A + I_{leak} \cdot dt_A = I_B \cdot dt_B + I_{leak} \cdot dt_B; \tag{6}$$

$$I_A \cdot dt_A - I_B \cdot dt_B = I_{leak} \cdot dt_B - I_{leak} \cdot dt_A; \tag{7}$$

$$I_A \cdot dt_A - I_B \cdot dt_B = I_{leak}(dt_B - dt_A); \text{ and} \tag{8}$$

$$I_{leak} = \frac{(I_A \cdot dt_A - I_B \cdot dt_B)}{(dt_B - dt_A)}. \tag{9}$$

In some implementations, the loads L1 and L2 are selected to be sufficiently different to provide reasonably different drop times and to have sufficiently low impedance/resistance so that the tests do not take too long. In addition, by selecting V1 and V2 to be close to the voltage of a fully charged state of the capacitor, the loss in energy (which equates to backup power time) is minimized, should an unexpected power loss event occur during the tests.

As described, the configuration of the output of the voltage sources Vs and the impedances of L1 and L2 allow the drain currents $I_A$ and $I_B$ flowing through L1 and L2, respectively, to be, for example, 5 mA and 10 mA. The power manager 132 can include suitable components for selecting a load (L1 or L2) such that the load current is 5 mA or 10 mA (instead of selecting a load impedance/resistance). Accordingly, in alternative examples, the drain currents $I_A$ and $I_B$ need not be calculated, and the pre-set drain currents $I_A$ and $I_B$ (e.g., 5 mA and 10 mA, respectively) can be used directly in expression (9).

To reduce or even eliminate the risk of losing critical data during testing of the capacitor, in one embodiment, the power manager 132 can increase the voltage of the capacitor C to partially or completely offset the energy discharged during testing prior to testing the capacitor C, as described in U.S. Publication No. 2019/0079125, titled TECHNIQUES FOR TESTING PLP CAPACITORS, filed on Sep. 13, 2017, which is incorporated herein by reference in its entirety. After the test of the capacitor C has been completed, the voltage of the capacitor C can be restored to its original level prior to the increase.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of blocks in the processes disclosed is an example of illustrative approaches. Based upon design preferences, it is understood that the specific order or hierarchy of blocks in the processes may be rearranged while remaining within the scope of the previous description. The accompanying method claims present elements of the various blocks in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the blocks of various examples must be performed in the order presented. As will be appreciated by one of skill in the art the order of blocks in the foregoing examples may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the examples disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The blocks of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other non-transitory medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for determining an abnormal leakage current of a capacitor, comprising:
maintaining stored values from leakage current tests of the capacitor in a storage for a maximum upper limit, a minimum upper limit, a maximum lower limit, and a minimum lower limit of leakage current values for the capacitor;
determining, using a test circuit coupled to the capacitor, a number of recent leakage current values for the capacitor;
determining a present upper limit and a present lower limit for the recent leakage current values;
updating the stored value of the maximum upper limit for the capacitor by replacing the maximum upper limit with the present upper limit if the present upper limit is greater than the stored value of the maximum upper limit;
updating the stored value of the minimum upper limit for the capacitor by replacing the minimum upper limit with the present upper limit if the present upper limit is lower than the stored value of the minimum upper limit;
updating the stored value of the maximum lower limit for the capacitor by replacing the maximum lower limit with the present lower limit if the present lower limit is greater than the stored value of the maximum lower limit;
updating the stored value of the minimum lower limit for the capacitor by replacing the minimum lower limit with the present lower limit if the present lower limit is lower than the stored value of the minimum lower limit; and
detecting the abnormal leakage current in response to determining that the present upper limit is greater than an upper threshold or the present lower limit is less than a lower threshold,
wherein the upper threshold is a determined value between the stored values of the maximum upper limit and the minimum upper limit, and the lower threshold is a determined value between the stored values of the maximum lower limit and the minimum lower limit.

2. The method of claim 1, wherein
the recent leakage current values are determined in the number of most-recent leakage current tests; and
each of the recent leakage current values is determined in a corresponding one of the most-recent leakage current tests.

3. The method of claim 2, wherein the maximum upper limit, the minimum upper limit, the maximum lower limit, and the minimum lower limit are determined in one or more leakage current tests performed on the capacitor before performance of the most-recent leakage current tests.

4. The method of claim 1, wherein determining the present upper limit and the present lower limit comprises:
determining a standard deviation and a mean of the recent leakage current values; and
determining the present upper limit and the present lower limit using the standard deviation and the mean.

5. The method of claim 4, wherein
the present upper limit is a sum of a first value and a second value;
the first value is the mean; and
the second value is a multiple of the standard deviation.

6. The method of claim 4, wherein
the lower upper limit is a first value subtracted by a second value;
the first value is the mean; and
the second value is a multiple of the standard deviation.

7. The method of claim 1, wherein
the present upper limit is between the maximum upper limit and the minimum upper limit; and
the present lower limit is between the maximum lower limit and the minimum lower limit.

8. The method of claim 1, wherein identifying the maximum upper limit, the minimum upper limit, the maximum lower limit, and the minimum lower limit comprises:
in response to determining that a first upper limit is greater than a stored maximum upper limit, setting the first upper limit as the maximum upper limit;
in response to determining that a second upper limit is less than a stored minimum upper limit, setting the second upper limit as the minimum upper limit;
in response to determining that a first lower limit is greater than a stored maximum lower limit, setting the first lower limit as the maximum lower limit; and
in response to determining that a second lower limit is less than a stored minimum lower limit, setting the second lower limit as the minimum lower limit.

9. The method of claim 8, wherein
the first upper limit is determined for the number of first leakage current values;
the second upper limit is determined for the number of second leakage current values;
the first lower limit is determined for the number of third leakage current values; and
the second lower limit is determined for the number of fourth leakage current values.

10. The method of claim 1, wherein
the upper threshold is an average of the maximum upper limit and the minimum upper limit; and
the lower threshold is an average of the maximum lower limit and the minimum lower limit.

11. The method of claim 1, further comprising determining each of the recent leakage current values based on two drain currents.

12. The method of claim 11, further comprising:
determining a first drain current using a first load;
determining a second drain current using a second load; and
determining each of the recent leakage current values based at least on the first drain current and the second drain current.

13. The method of claim 12, further comprising:
determining first time interval needed for a voltage across the first load to drop a predetermined voltage;
determining second time interval needed for a voltage across the second load to drop the predetermined voltage; and
determining each of the recent leakage current values based at least on the first drain current, the second drain current, the first time interval, and the second time interval.

14. A system for determining an abnormal leakage current of a capacitor, comprising
a processing circuit that:
maintains stored values from leakage current tests of the capacitor in a storage for a maximum upper limit, a minimum upper limit, a maximum lower limit, and a minimum lower limit of leakage current values for the capacitor;

determines, using a test circuit coupled to the capacitor, a number of recent leakage current values for the capacitor;

determines a present upper limit and a present lower limit for the recent leakage current values;

updates the stored value of the maximum upper limit for the capacitor by replacing the maximum upper limit with the present upper limit if the present upper limit is greater than the stored value of the maximum upper limit;

updates the stored value of the minimum upper limit for the capacitor by replacing the minimum upper limit with the present upper limit if the present upper limit is lower than the stored value of the minimum upper limit;

updates the stored value of the maximum lower limit for the capacitor by replacing the maximum lower limit with the present lower limit if the present lower limit is greater than the stored value of the maximum lower limit;

updates the stored value of the minimum lower limit for the capacitor by replacing the minimum lower limit with the present lower limit if the present lower limit is lower than the stored value of the minimum lower limit; and detects the abnormal leakage current in response to determining that the present upper limit is greater than an upper threshold or the present lower limit is less than a lower threshold, wherein the upper threshold is a determined value between the stored values of the maximum upper limit and the minimum upper limit, and the lower threshold is a determined value between the stored values of the maximum lower limit and the minimum lower limit.

15. The system of claim 14, wherein the processing circuit determines the recent leakage current values in the number of most-recent leakage current tests; and each of the recent leakage current values is determined in a corresponding one of the most-recent leakage current tests.

16. The system of claim 15, wherein the processing circuit determines the maximum upper limit, the minimum upper limit, the maximum lower limit, and the minimum lower limit in one or more leakage current tests performed on the capacitor before performance of the most-recent leakage current tests.

17. The system of claim 14, wherein the processor determines the present upper limit and the present lower limit by:

determining a standard deviation and a mean of the recent leakage current values; and determining the present upper limit and the present lower limit using the standard deviation and the mean.

18. The system of claim 17, wherein the present upper limit is a sum of a first value and a second value;

the first value is the mean; and the second value is a multiple of the standard deviation.

19. The system of claim 17, wherein the lower upper limit is a first value subtracted by a second value;

the first value is the mean; and the second value is a multiple of the standard deviation.

20. A system, comprising:

a capacitor for a solid state drive (SSD); and a power manager in a controller of the SSD comprising a processing circuit and a test circuit coupled to the capacitor having a first load and a second load, the processing circuit:

maintains stored values from leakage current tests of the capacitor of a maximum upper limit, a minimum upper limit, a maximum lower limit, and a minimum lower limit of leakage current values for the capacitor;

determines a number of recent leakage current values for the capacitor using the first load and the second load of the test circuit;

determines a present upper limit and a present lower limit for the recent leakage current values;

updates the stored value of the maximum upper limit for the capacitor by replacing the maximum upper limit with the present upper limit if the present upper limit is greater than the stored value of the maximum upper limit;

updates the stored value of the minimum upper limit for the capacitor by replacing the minimum upper limit with the present upper limit if the present upper limit is lower than the stored value of the minimum upper limit;

updates the stored value of the maximum lower limit for the capacitor by replacing the maximum lower limit with the present lower limit if the present lower limit is greater than the stored value of the maximum lower limit;

updates the stored value of the minimum lower limit for the capacitor by replacing the minimum lower limit with the present lower limit if the present lower limit is lower than the stored value of the minimum lower limit; and detects the abnormal leakage current based on the present upper limit, the present lower limit, the maximum upper limit, the minimum upper limit, the maximum lower limit, and the minimum lower limit.

* * * * *